United States Patent
Steinberg

(10) Patent No.: US 9,585,294 B2
(45) Date of Patent: Feb. 28, 2017

(54) ARRANGEMENT FOR ELECTROMAGNETIC SCREENING

(71) Applicant: NEXANS, Paris (FR)

(72) Inventor: Helmut Steinberg, Stornstein (DE)

(73) Assignee: NEXANS, Paris (FR)

( * ) Notice: Subject to any disclaimer, the term of this patent is extended or adjusted under 35 U.S.C. 154(b) by 0 days.

(21) Appl. No.: 14/744,240

(22) Filed: Jun. 19, 2015

(65) Prior Publication Data

US 2015/0382516 A1  Dec. 31, 2015

(30) Foreign Application Priority Data

Jun. 26, 2014 (EP) .................... 14306011

(51) Int. Cl.
 H05K 9/00 (2006.01)
 H01R 13/6591 (2011.01)
 H01B 1/02 (2006.01)
 H01B 3/30 (2006.01)
 H01R 13/6598 (2011.01)
 H02G 15/068 (2006.01)

(52) U.S. Cl.
 CPC .......... *H05K 9/0007* (2013.01); *H01B 1/023* (2013.01); *H01B 3/30* (2013.01); *H01R 13/6591* (2013.01); *H01R 13/6598* (2013.01); *H05K 9/009* (2013.01); *H02G 15/068* (2013.01)

(58) Field of Classification Search
 CPC .................................................. H05K 9/009
 USPC ........................................................ 174/359
 See application file for complete search history.

(56) References Cited

U.S. PATENT DOCUMENTS

| 5,554,678 A | 9/1996 | Katsumata et al. |
| 6,335,482 B1* | 1/2002 | Mason ..................... H01R 9/05 174/359 |
| 6,861,138 B1 | 3/2005 | Pfaff et al. |
| 2007/0021006 A1 | 1/2007 | Kawamura et al. |
| 2009/0145655 A1* | 6/2009 | Gladd .................. H05K 9/0098 174/378 |
| 2012/0319055 A1 | 12/2012 | Kim et al. |
| 2013/0056256 A1* | 3/2013 | Guillanton ........... H01R 9/0503 174/359 |
| 2014/0202762 A1 | 7/2014 | Adachi et al. |

FOREIGN PATENT DOCUMENTS

| DE | 3438660 | 4/1986 |
| WO | 0051143 | 8/2000 |

* cited by examiner

*Primary Examiner* — Hung V Ngo
(74) *Attorney, Agent, or Firm* — Sofer & Haroun, LLP

(57) ABSTRACT

Arrangement for electromagnetically screening a connection (1) between an electrical conductor (2) and an electrical coupling element (3) connected to the conductor (2) is proposed. The conductor has an electrically effective screen (4) of a synthetic material containing carbon fibers. The coupling element (3) is also surrounded by an electrically effective screen (5) of a synthetic material containing carbon fibers, which is integrally connected with the screen (4) of the conductor (2) to form an overall shield.

4 Claims, 1 Drawing Sheet

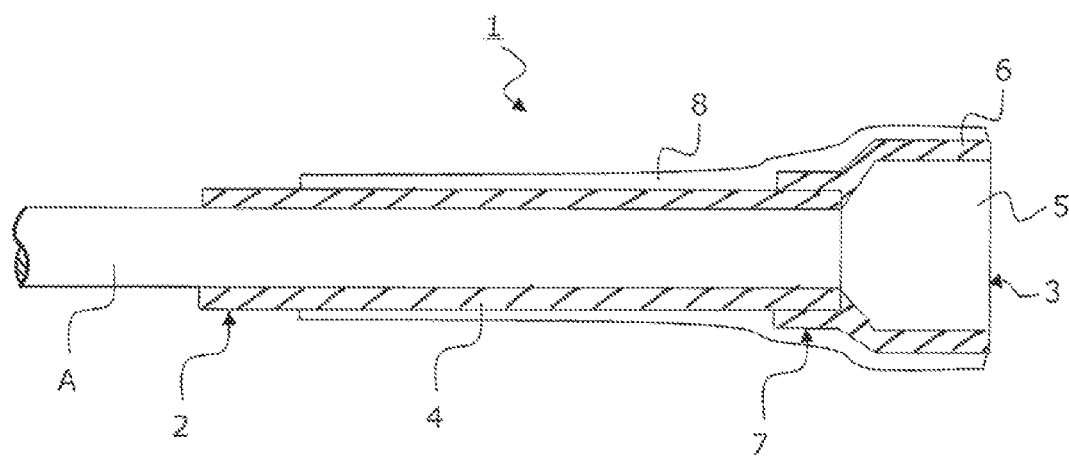

ARRANGEMENT FOR ELECTROMAGNETIC SCREENING

RELATED APPLICATION

This application claims the benefit from European Patent Application No. 14 306 011.9, filed on Jun. 26, 2014, the entirety of which is incorporated by reference.

BACKGROUND

Field of the Invention

The invention relates to an arrangement for electromagnetically screening of a connection between an electrical conductor and an electrical coupling element connected to the conductor, wherein the conductor has an electrically effective screen containing a synthetic material having carbon fibers.

Description of Related Art

Electrical conductors, which have at least one electrical line surrounded by an insulation have been used worldwide for years. The electrically effective screen consists predominately of copper wires which are formed as a non-woven material or as a stranded material around the insulation of the conductor.

Particularly in the manufacture of motor vehicles or in airplanes, a large quantity of such screen conductors are used which may be combined in compact units, for example, in cable harnesses or in cable sets. Therefore, the weight of such an electrical conductor is a decisive factor.

In particular in the automobile and aerospace industries it is therefore desirable to lower the weight of the conductor units in order to primarily reduce the fuel consumption. For this reason, it is known for example, to use aluminum or aluminum alloys instead of copper for the electrical conductors. It is also known from DE 199 07 675 A1 to manufacture the screen of the electrical conductor of a composite fiber material with electrically conductive fibers, for example, carbon fibers.

The screened conductors are, as a rule, connected to coupling elements, such as bushings or plugs, in order to be able to connect them to further conductive units, for example, to electrical components, or to the body of a motor vehicle. The coupling units may produce electromagnetic fields which can be connected to the body of a motor vehicle. The coupling elements can be permeable to harmful electromagnetic fields which can be produced by the conductor itself or by outside sources. The desired electromagnetic compatibility of such arrangements can be impaired as a result.

OBJECTS AND SUMMARY

The invention is based on the object of making available an arrangement for electromagnetically screening a connection between an electrical conductor and a coupling element which ensures a gap-free screening from the conductor up to and beyond the coupling element and the further electrical units connected thereto.

In accordance with the invention, this object is met in that the coupling element is also surrounded by an electrically effective screen of a material containing carbon fibers which is integrally connected to the screen to form an overall shield.

The arrangement according to the invention permits an effective electromagnetic screening of the connection between conductor and coupling element, which ensures that the electromagnetic compatibility of the electrical connection within an electric plant is not impaired by the existence of a coupling. The screens of the conductor and the coupling element are placed on the same potential. The arrangement according to the invention has additionally several advantages as compared to a conventional arrangement with metal cable shields, metal plug or bushing housings, and with metal contact elements. The arrangement according to the invention has a particularly low weight and is therefore particularly advantageous for use in automobiles and aircraft. For example, the arrangement can be used for high current applications in hybrid or electric automobiles. In addition, the arrangement is safe, has a long service life and is very inexpensive.

A synthetic material containing carbon fibers is called carbon in colloquial usage. This denomination is also to be used in the following. Carbon is a synthetic fiber composite material in which carbon fibers are embedded in a matrix. The synthetic material consists, for example, of a duroplastic material, for example, an epoxide resin, of a thermoplastic material or a ceramic material. Carbon has an electrical conductivity which is smaller than that of copper, however, which is sufficient for an effective electromagnetic screening, particularly in the field of automobiles.

In accordance with a particularly preferred embodiment, the screen of the coupling element and the screen of the cable are connected to each other by means of an electrically conductive adhesive 10 to form the overall shield. The use of an electrically conductive adhesive is of particular advantage because this adhesive can penetrate during production of the overall shield into the matrix structure of the carbons of the individual screens, so that particularly after curing of the adhesive, a particularly strong material connection can be achieved between the two screens.

BRIEF DESCRIPTION OF THE DRAWINGS

In accordance with a particularly preferred embodiment, the arrangement according to the invention is used in automobile construction, i.e. for electrically conductive connections within a motor vehicle.

DETAILED DESCRIPTION

The arrangement according to the invention is explained with the aid of the drawing. FIG. 1 shows schematically an embodiment of an arrangement for electromagnetically screening a connection between an electrical conductor and an electrical coupling element.

FIG. 1 shows schematically the end of an electrical conductor 2. The conductor 2 comprises a strand A which includes an electrical line and an insulation of synthetic material (not illustrated) which surrounds the electrical line. The electrical conductor may be constructed, for example, of copper or of aluminum or an aluminum alloy.

An electrically effective screen 4 of carbon is mounted around the strand A. The carbon is present, for example, in the form of fibers or threads which can he formed by means of a known spinning machine as a non-woven fabric or as a stranded fabric around the insulation of the strand A. Carbon can also be wound as a prepared band around the strand A. Furthermore, the carbon can be pre-formed as a hose and subsequently pulled or pushed over the strand A.

The conductor 2 is connected to a schematically illustrated coupling element 3. The schematically illustrated coupling element 3 is, for example, a plug or a bushing. In accordance with the invention, the housing 5 of the coupling element 3 is surrounded by an electrically effective screen 6 of carbon. This carbon screen 6 can, in a manner similar to the conductor 2, be mounted on the coupling element 3. The housing 5 of the coupling element 3 consists advantageously of an insulating synthetic material.

Screen 6 of the coupling element 3 is integrally connected to the screen 4 of the conductor 2. Therefore, the two screens 4, 6 form an overall shield which gap-free surrounds the connection between conductor 2 and coupling element 3.

In accordance with a particularly preferred embodiment of the invention, the integral connection of the screens 4, 6 of the conductor 2 and the coupling element 3 is achieved by a conductive adhesive. The adhesive is applied to the carbon fibers or fiber construction of both shields 4, 6, so that the shields are impregnated with adhesive 10. The two screens 4, 6 which have been impregnated in this manner by this adhesive are subsequently placed on each. other. For example, the screen 6 of the coupling element 3 may protrude slightly over the screen 4 of the conductor 2 and they may rest on each other, as illustrated in FIG. 1, at reference number 7. When adhesive 10 is cured, the integral connection between the two screens 4, 6 is created. Conductive adhesive 10 may be, for example, an epoxy resin or a polyester resin which is interspersed with conductive particles, for example, of nickel or of carbon.

The connection 1 provided with the overall shield can additionally be surrounded by a layer 8 of insulating material. The layer 8 serves as a protection against accidental contact. It may be applied, for example, in a casting process. If the conductor 2 is a cable which is not normally current conductive, for example a grounding cable in a motor vehicle connected to the motor chassis, the insulating layer 8 can be omitted.

Suitable materials for the insulation of the strand 2, the housing 5 of the coupling element 3 and the final closing layer 8 are, for example, polyethylene, polypropylene, polyvinylchloride and polyurethane.

The invention claimed is:

1. Arrangement for electromagnetically screening a connection between an electrical conductor and an electrical coupling element connected to the conductor comprising:
    the conductor has a first electrically effective screen of a synthetic material containing carbon fibers; and
    wherein the coupling element is also surrounded by a second electrically effective screen of a synthetic material containing carbon fibers which is connected integrally to the first electrically effective screen of the conductor to form an overall shield, wherein the second electrically effective screen of the coupling element and the first electrically effective screen of the conductor are connected by means of an electrically conductive adhesive, said electrically conductive adhesive penetrating into matrix structures of carbons in said first and second electrically effective screens forming an overall screen.

2. Arrangement according to claim 1, wherein the overall shield is surrounded by a layer of insulating material.

3. Arrangement according to claim 1, wherein a line of the conductor is composed of aluminum or an aluminum alloy.

4. Arrangement according to claim 1, wherein the coupling element is a plug or a bushing.

* * * * *